United States Patent [19]
Dearth et al.

[11] Patent Number: 5,881,267
[45] Date of Patent: Mar. 9, 1999

[54] VIRTUAL BUS FOR DISTRIBUTED HARDWARE SIMULATION

[75] Inventors: Glenn A. Dearth, Groton; Paul M. Whittemore, Marlborough, both of Mass.

[73] Assignee: Sun Microsystems, Inc., Palo Alto, Calif.

[21] Appl. No.: 621,775

[22] Filed: Mar. 22, 1996

[51] Int. Cl.⁶ .................................................. G06F 9/455
[52] U.S. Cl. ........................................................ 395/500
[58] Field of Search .................................. 395/500, 800; 364/200, 900, 578, 488, 489, 490, 131, 133, 240; 371/23

[56] References Cited

U.S. PATENT DOCUMENTS

| | | | |
|---|---|---|---|
| 4,821,173 | 4/1989 | Young et al. | 364/578 |
| 4,937,827 | 6/1990 | Beck et al. | 364/578 |
| 5,185,865 | 2/1993 | Pugh | 395/275 |
| 5,327,361 | 7/1994 | Long et al. | 395/500 |
| 5,455,928 | 10/1995 | Herlitz | 395/500 |

OTHER PUBLICATIONS

Ososanya et al., VLSI Design of a Bus Arbitration Module for the 68000 Series of Microprocessors, IEEE, pp. 398–402, Apr. 10, 1994.
Coelho, A VHDL Standard Package for Logic Modeling, IEEE, pp. 25–32, Jun. 1990.
Taub, Corrected Settling Time of the Distributed Parallel Arbiter, IEEE, pp. 348–354, Jul. 1992.

*Primary Examiner*—Kevin J. Teska
*Assistant Examiner*—Matthew Loppnow
*Attorney, Agent, or Firm*—James D. Ivey

[57] ABSTRACT

Virtual bus stubs, which can be distributed among constituent computers of a computer network, and a central resolver cooperate to simulate a bus which is connected between multiple circuit parts of a simulated circuit. With each simulated cycle of a clock of the bus, the resolver (i) collects data from the virtual bus stubs representing signals driven on the bus by one or more of the circuit parts, (ii) resolves the current simulated state of the bus from the collected data, and (iii) sends data representing the resolved current simulated state of the bus to the virtual bus stubs. As a result, the virtual bus stubs and the resolver collectively accurately simulate the bus connecting the circuit parts. Since each circuit part has access to the simulated state of the bus through a respective virtual bus stub, each circuit part has access to all information regarding the simulated state of simulated circuit which is necessary for the accurate simulation of each circuit part. Busses provide a convenient organization for division of parts of a model of the circuit. The bus protocol provides a convenient protocol for exchange of information between simulated circuit parts since the bus protocol is an inherent part of any simulation of each of the circuit parts. In addition, since the circuit parts communicate with one another exclusively through the bus, each circuit part requires no information regarding the state of the other circuit part beyond the state of the bus. Thus, the state of the bus includes all the information about each of the circuit parts and to which each other of the circuit parts requires access.

12 Claims, 11 Drawing Sheets

VIRTUAL BUS FOR DISTRIBUTED HARDWARE SIMULATION

CROSS-REFERENCE TO RELATED APPLICATIONS

The following copending U.S. patent applications are related to the present disclosure and the disclosures thereof are incorporated herein by reference: (i) a copending U.S. patent application Ser. No. 08/620,439 for "Interface for Interfacing Simulation Tests Written in a High-Level Programming Language to a Simulation Model" by Glenn A. Dearth, Paul M. Whittemore, David A. Medeiros, George R. Plouffe, Jr., and Bennet H. Ih filed on Mar. 21, 1996 hereinafter the "Interface Application"), (ii) a copending U.S. patent application Ser. No. 08/621,777 for "Deadlock Avoidance Mechanism for Virtual Bus Distributed Hardware Simulation" by Glenn A. Dearth filed on Mar. 21, 1996 hereinafter the "Deadlock Avoidance Application"), (iii) a copending U.S. patent application Ser. No. 08/621,818 for "Device Reservation Mechanism for Distributed Hardware Simulation" by Glenn A. Dearth filed on Mar. 21, 1996 hereinafter the "Reservation Application"), (iv) a copending U.S. patent application Ser. No. 08/621,776 for "Object-Oriented Development Framework for Distributed Hardware Simulation" by Glenn A. Dearth and Bennet H. Ih filed on Mar. 21, 1996 hereinafter the "Framework Application"), and (v) a copending U.S. patent application Ser. No. 08/621,816 for "Synchronization Mechanism for Distributed Hardware Simulation" by Glenn A. Dearth and Paul M. Whittemore filed on Mar. 21, 1996 hereinafter the "Synchronization Application").

FIELD OF THE INVENTION

The present invention relates to computer simulation of electronic circuitry and, in particular, to a method and apparatus for particularly efficient simulation of complex circuitry using models distributed over a computer network.

BACKGROUND OF THE INVENTION

In designing complex circuitry such as application-specific integrated circuits ("ASICs"), the designed logic of such circuitry is typically simulated in a computer using data and computer programs to thereby test the viability and accurate performance of the designed logic. By doing so, design flaws can be detected prior to expending the time and engineering and financial resources required to physically build the circuitry. To simulate circuitry using data and computer programs, the circuitry is described in a hardware description language ("HDL") to form a model. One example of an HDL is the Verilog HDL processed by the Cadence Verilog hardware simulator available from Cadence Design Systems, Inc. of San Jose, Calif. The HDL model of a circuit typically includes a description of components of the state of the circuit and a description of the behavior of the circuit. The behavior of the circuit generally includes inter-relationships between various components of the state of the circuit.

A hardware simulator then uses the HDL model of the circuitry to simulate the circuitry. The hardware simulator is a computer process which accepts data defining signals to be placed on certain parts of the simulated circuit and then changes the state of the circuit in accordance with the signals. The certain parts of the circuit include, for example, terminals, lines, or registers of the simulated circuit.

Circuitry which is simulated in this manner is becoming increasingly complex reducing significantly the feasibility of simulation of such circuitry on a single computer processor. Factors which contribute significantly to such reduction in feasibility in simulations of particularly complex circuits include intolerable amounts of time and computer resources which are required for such complex simulations to execute. For example, simulating a particularly complex circuit in a single computer may require more memory than is available within the single computer. Distribution of circuit simulations over computer networks is one solution. Distributing over constituent computers of a computer network a model simulating a complex circuit generally involves partitioning the model into discrete model parts and distributing those parts among the constituent computers of the computer network.

Distributing a circuit simulation over multiple computers of a computer network increases the complexity of such a simulation significantly. For example, each of the distributed model parts must generally know something about other distributed model parts, at least to the extent that the distributed model parts interact. In addition, since each of the distributed model parts executes independently of other distributed model parts, some mechanism must generally be provided to synchronize interaction between the distributed model parts. For example, if a component of the state of a first model part is dependent upon other components of the state of the first model part and components of the state of a model simulation part, execution of the first and second model parts must generally be synchronized to ensure accuracy of the state simulated by the first model part.

To distribute parts of a complex simulation of a particularly complex circuit, special purpose software is sometimes constructed to process communication and interaction between the distributed parts of the simulation and to coordinate and synchronize execution of the distributed parts of the simulation. Such software can execute particularly efficiently since design verification engineers, when constructing the software, can customize and optimize the software according to the particular requirements of the complex simulation. However, such software suffers from a significant disadvantage. Such software generally requires a substantial amount of time and effort to construct and is generally a complex and difficult task. As a result, constructing such software represents a substantial portion of the time required to simulate a particularly complex circuit and to verify the design of the circuit. In addition, such software is typically non-extensible, i.e., cannot be readily adapted to simulate a different circuit. In other words, once such software is constructed to orchestrate execution of a complex, distributed simulation, small changes in the design of the circuit generally require that the software be substantially rewritten altogether to orchestrate execution of the changed, complex, distributed simulation.

An alternative to distributing execution of a simulation of a particularly complex circuit is to simplify the simulation to mimic the designed behavior of the circuit rather than requiring that the simulation to simulate each component of the particular design of the circuit. Since the simulation is simplified and does not simulate each component of the particular design of the circuit, execution of the simulation within a single computer may be feasible. This approach suffers from the disadvantage that care must be taken to ensure that the behavior mimicked by the simulation is, in fact, accurately representative of the behavior of the circuit as designed. Thus, in essence, the engineer who designs and implements the simulation must determine to an appreciable degree the precise behavior of the circuit as designed. In general, it is preferable that determining the precise behavior of the circuit is done by the simulation and not by the engineer designing and implementing the simulation. In addition, if the design of the circuit is changed, perhaps in response to design flaws discovered during the simulation of the circuit, the behavior of the circuit must again be determined and mimicked by a simplified simulation.

Thus, a satisfactory mechanism by which parts of a simulation of a circuit can be distributed among multiple computers of a computer network and by which such distributed model parts can be coordinated and synchronized persists as a need in the simulation and verification of circuit designs.

SUMMARY OF THE INVENTION

In accordance with the present invention, virtual bus stubs, which can be distributed among constituent computers of a computer network, and a central resolver cooperate to simulate a bus which is connected between multiple circuit parts of a simulated circuit. A bus is a collection of one or more signal pathways between two or more circuit parts of a simulated circuit which are accessed according to a common clock signal. With each simulated cycle of a clock of the bus, the resolver (i) collects data from the virtual bus stubs representing signals driven on the bus by one or more of the circuit parts, (ii) resolves the current simulated state of the bus from the collected data, and (iii) sends data representing the resolved current simulated state of the bus to the virtual bus stubs. As a result, the virtual bus stubs and the resolver collectively accurately simulate the bus connecting the circuit parts.

Since each circuit part has access to the simulated state of the bus through a respective virtual bus stub, each circuit part has access to all information regarding the simulated state of simulated circuit which is necessary for the accurate simulation of each circuit part.

In particularly complex circuits, such as ASICs, busses provide a convenient organization for division of parts of a model of the circuit. For example, circuit parts of the simulated circuit, which communicate through a single bus, exchange information in a precisely controlled and well-defined manner which is dictated by a bus protocol. Therefore, the bus protocol provides a convenient protocol for exchange of information between simulated circuit parts. Since each of the circuit parts must adhere to the bus protocol implemented by the bus, the bus protocol is an inherent part of any simulation of each of the circuit parts. In addition, since the circuit parts communicate with one another exclusively through the bus, each circuit part requires no information regarding the state of the other circuit part beyond the state of the bus. Thus, the state of the bus includes all the information about each of the circuit parts and to which each other of the circuit parts requires access. In addition, in nearly every circuit which includes a bus, access to the bus is synchronized according to a bus clock. Each simulated cycle of the bus clock represents a time at which the simulation of each of the circuit parts should be synchronized. Between each synchronization at a respective bus clock cycle, the simulation of each of the circuit parts is free to execute independently.

DETAILED DESCRIPTION

Figure 1:
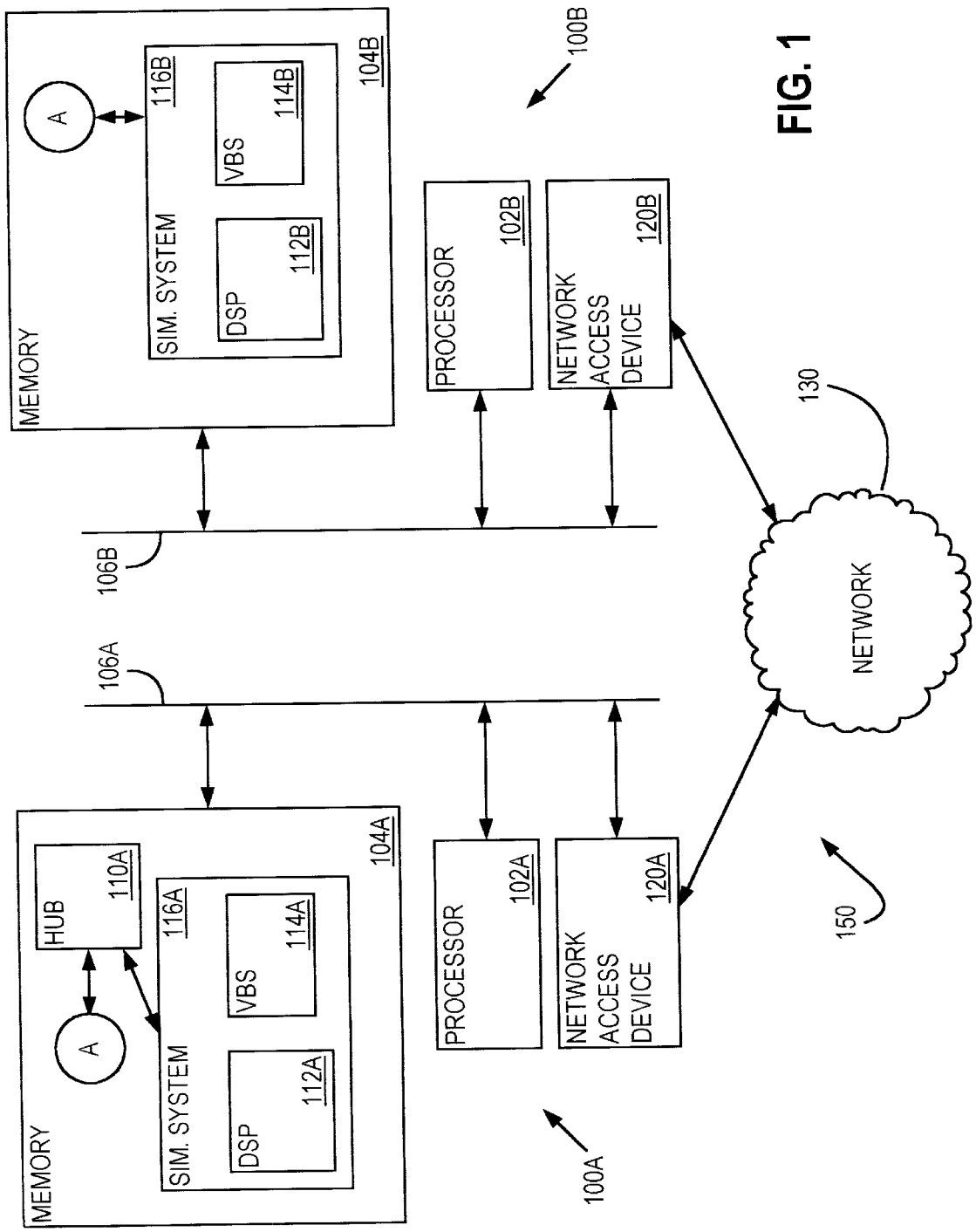
FIG. 1 is a block diagram of two computers connected through a network to form a computer network in which simulation of a circuit is distributed in accordance with the present invention.
Figure 2:
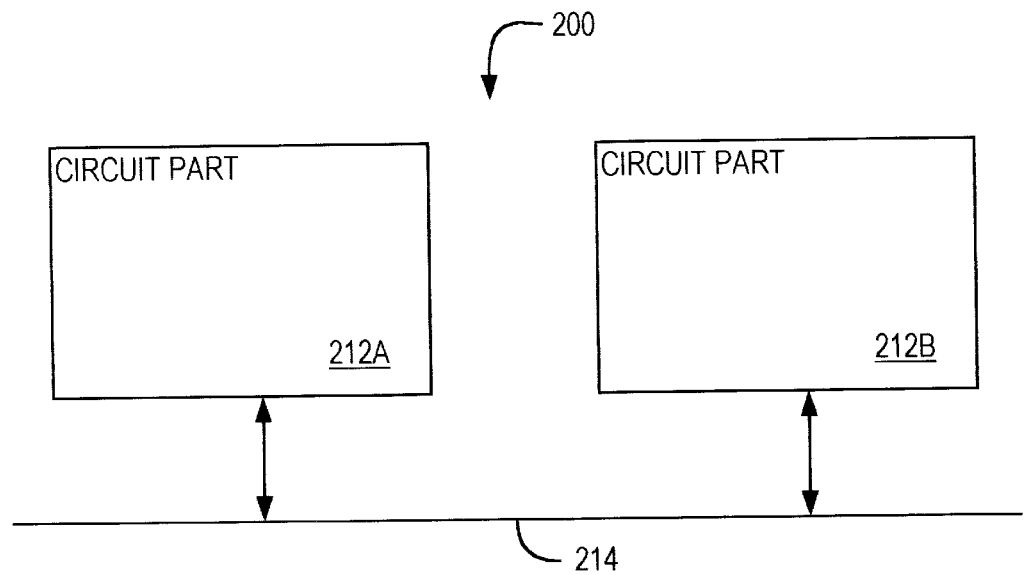
FIG. 2 is a block diagram of a circuit which is simulated in the distributed simulation of FIG. 1.

In accordance with the present invention, virtual bus stubs ("VBSs") 114A and 114B (FIG. 1) are included in simulation systems 116A and 116B, respectively, and collectively simulate a bus 214 (FIG. 2) which is connected between circuit parts 212A and 212B which in turn simulated by distributed simulation parts ("DSPs") 112A (FIG. 1) and 112B. In this simple, illustrative example, DSPs 112A and 112B are distributed model parts and collectively simulate a complete, simulated circuit 200 (FIG. 2). VBS 114A (FIG. 1) represents in simulation system 116A the simulated state of bus 214 (FIG. 2). Similarly, VBS 114B (FIG. 1) represents in simulation system 116B the simulated state of bus 214 (FIG. 2). While each simulation system is shown to include only one VBS, it is appreciated that more complex circuitry can contain multiple busses, and simulation systems 116A–B can therefore include multiple VBSs to represent such busses.

With each simulated cycle of a clock of bus 214, a hub 110A (FIG. 1) (i) collects data which represents components of the simulated state of bus 204 (FIG. 2) from VBSs 114A (FIG. 1) and 114B, (ii) resolves the current simulated state of bus 214 (FIG. 2), and (iii) sends data representing the resolved state of the simulated bus to VBSs 114A (FIG. 1) and 114B. As a result, VBSs 114A and 114B collectively accurately simulate bus 214 (FIG. 2) which connects circuit parts 212A and 212B which are in turn simulated by DSPs 112A (FIG. 1) and 112B, respectively. Since DSP 112A has access to the simulated state of bus 214 (FIG. 2) through VBS 114A (FIG. 1), DSP 112A has access to all information regarding the simulated state of circuit 200 (FIG. 2) which is necessary for the accurate simulation of circuit part 212A by DSP 112A (FIG. 1). Similarly, since DSP 112B has access to the simulated state of bus 214 (FIG. 2) through VBS 114B (FIG. 1), DSP 112B has access to all information regarding the simulated state of circuit 200 (FIG. 2) which is necessary for the accurate simulation of circuit part 212B by DSP 112B (FIG. 1).

While hub 110A is shown to be executing within a computer in which a simulation system is executing, such is not required. Hub 110A can execute in a computer in which no other simulation systems execute. For example, hub 110A can resolve a simulated bus state from data received from simulation systems 116A–B if hub 110A executes within computer 100A and simulation systems 116A–B execute within computer 100B.

In particularly complex circuits, such as ASICs or circuits involving several ASICs, busses provide a convenient organization for division of parts of a model of the circuit. For example, circuit components 212A and 212B (FIG. 2) of circuit 200, which communicate through a single bus 214, exchange information in a precisely controlled and well-defined manner which is dictated by a bus protocol. Therefore, the bus protocol provides a convenient protocol for exchange of information between DSPs representing circuit parts 212A and 212B, i.e., DSPs 112A (FIG. 1) and 112B. Since each of circuit parts 212A and 212B must adhere to the bus protocol implemented by bus 214, the bus protocol is an inherent part of the design of each of DSPs 112A (FIG. 1) and 112B. In addition, since circuit parts 212A (FIG. 2) and 212B communicate with one another exclusively through bus 214, each circuit part requires no information regarding the state of the other circuit part beyond the state of bus 214. Thus, the state of bus 214 includes all the information about each of circuit parts 212A and 212B to which each other of circuit parts 212A and 212B requires access. In addition, in circuit 200 as in nearly every circuit which includes a bus, access to bus 214 is synchronized according to a bus clock. Each simulated cycle of the bus clock represents a time at which each of DSPs 112A (FIG. 1) and 112B should be synchronized. Between each synchronization at a respective bus clock cycle, each of DSPs 112A and 112B is free to execute independently.

FIG. 1 shows computers 100A and 100B connected to one another through a network 130 to form a computer network 150. Each of computers 100A and 100B are directly analogous to one another, and the following description of computer 100A is equally applicable to computer 100B except as otherwise noted.

Computer 100A includes a processor 102A which fetches computer instructions from a memory 104A through a bus 106A and executes those computer instructions. In executing computer instructions fetched from memory 104A, processor 102A can retrieve data from or write data to memory 104A, display information on one or more computer display devices (not shown), receive command signals from one or more user-input devices (not shown), or transfer data to computer 100B through network 130. Processor 102A can be, for example, any of the SPARC processors available from Sun Microsystems, Inc. of Mountain View, Calif. Memory 104A can include any type of computer memory including, without limitation, randomly accessible memory (RAM, read-only memory (ROM), and storage devices which include magnetic and optical storage media such as magnetic or optical disks. Computer 100A can be, for example, any of the SPARCstation workstation computer systems available from Sun Microsystems, Inc. of Mountain View, Calif.

Computer 100A also includes a network access device 120A, through which computer 100A is coupled to network 130. Network access device 120A retrieves data from and writes data to network 130 in accordance with control signals received from processor 102A through bus 106A. Data retrieved from or written to network 130 generally includes information specifying a computer connected to network 130 as the destination and/or the source of the information. Thus, information can be transferred between a computer process executing in processor 102A from memory 104A and a computer process executing in processor 102B from memory 104B, both of computer 100B, through network 130.

For example, simulation system 116B can transfer data to hub 110A by including computer instructions which, when executed by processor 102B, cause processor 102B to transfer the data, including specification of hub 110A of computer 100A as the recipient of the data, to network access device 120B and to issue control signals to network access device 120B to send the data through network 130. Network access device 120B, in response to the control signals, sends the data to network 130, which forwards the data to computer 100A in accordance with the specification of the recipient. Network access device 120A retrieves the data from network 130 and transfers the data to processor 102A which then writes the data to hub 110A in accordance with the specification of the recipient. The transfer of data between computers 100A and 100B through network 130 is conventional and well-known.

Network access device 120A can be generally any circuitry which is used to transfer data between a computer and network such as computer 100 and network 130 and can be, for example, an Ethernet controller chip or a modem. Sun, Sun Microsystems, and the Sun Logo are trademarks or registered trademarks of Sun Microsystems, Inc. in the United States and other countries. All SPARC trademarks are used under license and are trademarks of SPARC International, Inc. in the United States and other countries. Products bearing SPARC trademarks are based upon an architecture developed by Sun Microsystems, Inc.

Simulation system 116A is a computer process executing in processor 102A from memory 104A. Simulation system 116A includes data defining a model of a simulated circuit and simulates the circuit in accordance with the data. In simulating circuits, simulation system 116A receives test data defining simulated signals to be applied to components of the circuit simulated by the model and produces result data which represents signals produced by the simulated circuit in response to the test data. The test data and result data collectively define a test transaction of the simulated circuit. A simple test transaction can include, for example, test data which represents signals to be stored in a register of the simulated circuit, data indicating that a clock signal is to be applied to the simulated circuit, and specification of resulting data which is to be retrieved from the same or other registers of the simulated circuit after application of one or more cycles of the clock signal. Simulation system 116A can be, for example, the Cadence Verilog hardware simulator available from Cadence Design Systems, Inc. of San Jose, Calif.

The model within simulation system 116A which represents a simulated circuit is generally in the form of a hardware description language ("HDL") and generally includes data defining input signals to the circuit, output signals of the circuit, internal signals of the circuit (e.g., signals stored in registers), and inter-relationships between the input signals, output signals, and internal signals. Simulation system 116A includes DSP 112A which, as described above, represents in HDL circuit part 212A (FIG. 2) of circuit 200. Simulation system 116B (FIG. 1) is directly analogous to simulation system 116A and the foregoing description of simulation system 116A is equally applicable to simulation system 116B. Simulation system 116B includes DSP 112B which represents in HDL circuit part 212B (FIG. 2).

Simulation system 116A (FIG. 1) also includes VBS 114A which represents the simulated state of bus 214 (FIG. 2) and which simulates within simulation system 116A the interaction of circuit part 212A (FIG. 2) with bus 214. As described more completely below, from the perspective of DSP 112A, VBS 114A simulates all devices coupled to bus 214 (FIG. 2) other than circuit part 212A. Similarly, simulation system 116B (FIG. 1) includes VBS 114B which represents the simulated state of bus 214 (FIG. 2) and which simulates within simulation system 116B (FIG. 1) the interaction of circuit part 212B (FIG. 2) with bus 214. Simulation system 116B (FIG. 1), DSP 112B, and VBS 114B are directly analogous to simulation system 116A, DSP 112A, and VBS 114A, respectively. Accordingly, the following description of simulation system 116A, DSP 112A, and VBS 114A is equally applicable to simulation system 116B, DSP 112B, and VBS 114B. It should be noted that, in the described embodiment of the present invention, a single hub, i.e., hub 110A, communicates with VBSs 114A and 114B to resolve a simulated bus state of bus 214 (FIG. 2).

Figure 3:
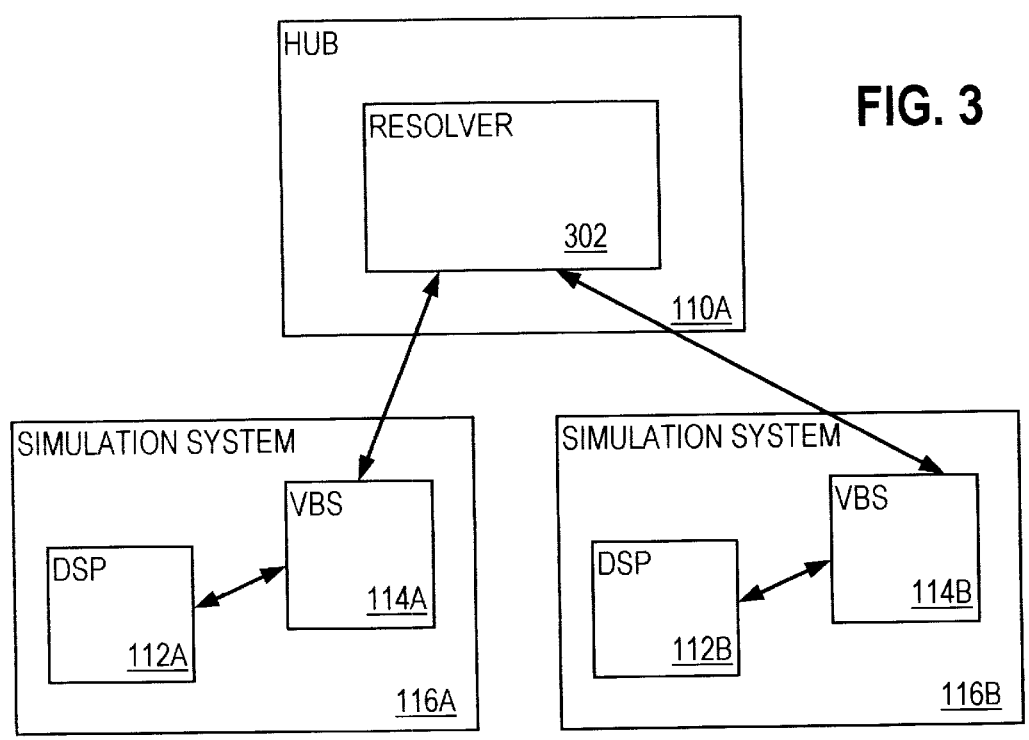
FIG. 3 is a block diagram of simulation systems and a hub which execute in the computer network of FIG. 1 to effect the distributed simulation of FIG. 1.

FIG. 3 shows simulation systems 116A and 116B and hub 110A of FIG. 1 in more detail. Simulation system 116A is configured such that driving a line of bus 214 (FIG. 2) by circuit part 212A is simulated by a data transfer from DSP 112A (FIG. 3) to VBS 114A and sampling a line of bus 214 (FIG. 2) by circuit part 212A is simulated by a data transfer from VBS 114A (FIG. 3) to DSP 112A. Hub 110A includes a resolver 302 which resolves the state of bus 214 (FIG. 2) as simulated by VBSs 114A (FIG. 3) and 114B.

For every cycle of a simulated bus clock which controls access to bus 214 (FIG. 2), VBS 114A (FIG. 3) transfers to resolver 302 data indicating the state of bus 214 (FIG. 3) as represented by VBS 114A (FIG. 3). The transfer of data representing the state of a bus from a VBS, e.g., VBS 114A (FIG. 3), to resolver 302 is sometimes referred to herein as "posting." VBS 114A posts simulated bus signals at a time when changes in the state of bus 214 (FIG. 2) has no effect on the state of circuit part 212A as simulated by DSP 112A (FIG. 3). For example, if circuit part 212A samples bus 214 at the rising edge of the clock of bus 214, VBS 114A posts simulated bus signals to hub 110A at a simulation time which is past the rising edge of the clock of bus 214 (FIG. 2) and by which time circuit part 212A would no longer be sampling bus 214.

VBS 114B similarly transfers to resolver 302 data indicating the simulated state of bus 214 (FIG. 2) as represented by VBS 114B (FIG. 3) at an analogous simulation time. Resolver 302 resolves the simulated state of bus 214 (FIG. 2) from data received from VBSs 114A (FIG. 3) and 114B and transfers to VBSs 114A and 114B data representing the resolved state of bus 214 (FIG. 2). The transfer of data representing the resolved simulated state of a bus from resolver 302 to a VBS is sometimes referred to herein as "reaping." Thus, VBSs 114A (FIG. 3) and 114B and resolver 302 cooperate to accurately simulate bus 214 (FIG. 2) to thereby allow DSPs 112A (FIG. 3) and 112B to independently and accurately simulate circuit parts 212A (FIG. 2) and 212B, respectively, in the context of circuit 200. As a result, circuit parts 212A and 212B can be easily and effectively simulated on two different constituent computers of computer network 150 (FIG. 1).

During posting by VBS 114A, processing of simulation system 116A is stopped to freeze the state of circuit part 212A (FIG. 2) as represented by DSP 112A (FIG. 3) remains unchanged during the resolving of the state of bus 214 (FIG. 2). After reaping the resolved simulated state of bus 214 by VBS 114A (FIG. 3), processing of simulation system 116A is resumed. DSP 112A is then free to access from VBS 114A through line 414 data representing the resolved state of bus 214 (FIG. 2).

Figure 4:
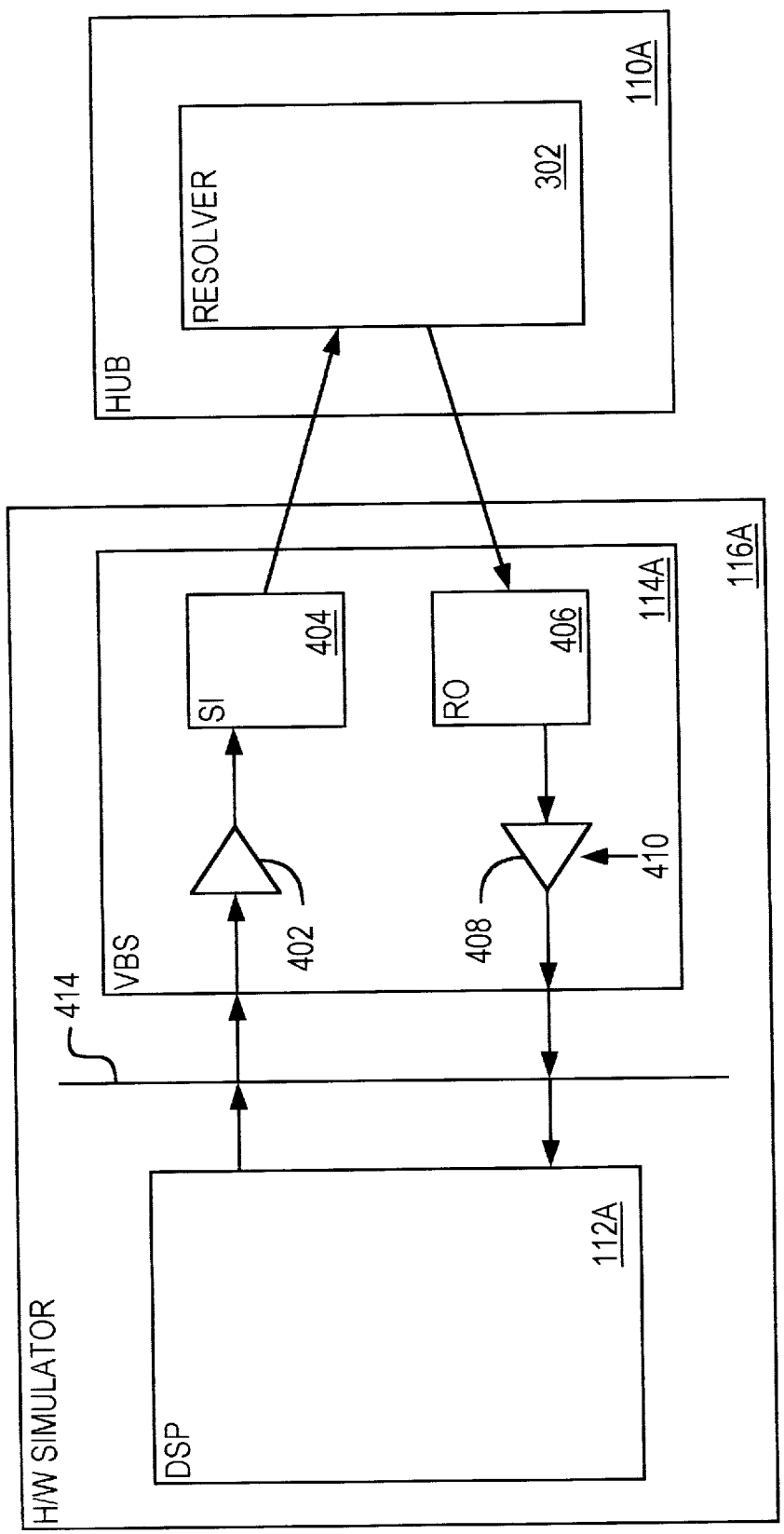
FIG. 4 is a block diagram of the hub and a simulation system of FIG. 3 in greater detail.

Simulation system 116A is shown in greater detail in FIG. 4. In FIG. 4, simulation system 116A is shown to simulate a single line 414 of bus 214 (FIG. 2). All VBSs which cooperate to simulate bus 214, e.g., VBS 114B (FIG. 3), similarly simulate line 414 (FIG. 4). VBS 114A represents all circuit parts coupled to bus 214 (FIG. 2) other than circuit part 212A and is defined in HDL to include an input buffer 402 (FIG. 4), a sampled input register 404, a resolved output register 406, an output buffer 408, and a control signal 410. To simulate circuit part 212A (FIG. 2) driving line 414 of bus 214, DSP 112A (FIG. 4) applies a simulated signal to line 414 and therethrough to input buffer 402 of VBS 114A. During posting, VBS 114A samples from input buffer 402 and stores the simulated signal in sampled input register 404. VBS 114A transfers data representing the simulated signal to resolver 302. In resolving the state of line 414 of bus 214 (FIG. 2), resolver 302 (FIG. 4) collects data representing the simulated state of line 414 (FIG. 2) from all VBSs which simulate line 414. Once the simulated state of line 414 is resolved in a manner described more completely below, resolver 302 (FIG. 4) transfers to VBS 114A data representing a resolved simulated signal on the simulated line.

VBS 114A stores in resolved output register 406 a simulated signal represented by the data received from resolver 302. After reaping from resolver 302 data representing the resolved state of line 414, VBS 114A drives the resolved signal on line 414 within simulation system 116A. In VBS 114A, the resolved signal stored in resolved output register 406 is applied to the input of output buffer 408. Control signal 410 forces output buffer 408 to a high impedance state (i) during sampling of line 414 by VBS 114A or (ii) if the simulated signal stored in sampled input register 404 is not a high-impedance single, i.e., has a logical value of "0" or "1", and the simulated signal stored in resolved output register 406 does not represent a collision on the simulated line. Thus, VBS 114A does not drive a signal on line 414 when DSP 112A is driving a signal on line 414 or when VBS 114A is sampling line 414. Otherwise, the simulated signal stored in resolved output buffer 406 is passed through output buffer 408 and is driven on line 414 and can therefore be sampled by DSP 112A.

In FIG. 4, DSP 112A both drives and samples line 414 of bus 214 (FIG. 2). It is also possible that DSP 112A either drives but does not sample line 414 or samples but does not drive line 414. If DSP 112A does not sample line 414, resolved output register 406, output buffer 408, and control signal 410 are superfluous and, in one embodiment, are omitted altogether. If DSP 112A does not drive line 414 but samples line 414, VBS 114A does not sample line 414 but instead stores data representing a high impedance state, i.e., a logical "Z", in sampled input register 404 and accordingly always posts a logical "Z" to resolver 302 during resolution of the state of line 414 of bus 214 (FIG. 2). By posting a logical "Z", VBS 114A is counted by resolver 302 as participating in a particular resolution of the state of bus 214 (FIG. 2) but does not affect the resolved state of bus 214.

Figure 5:
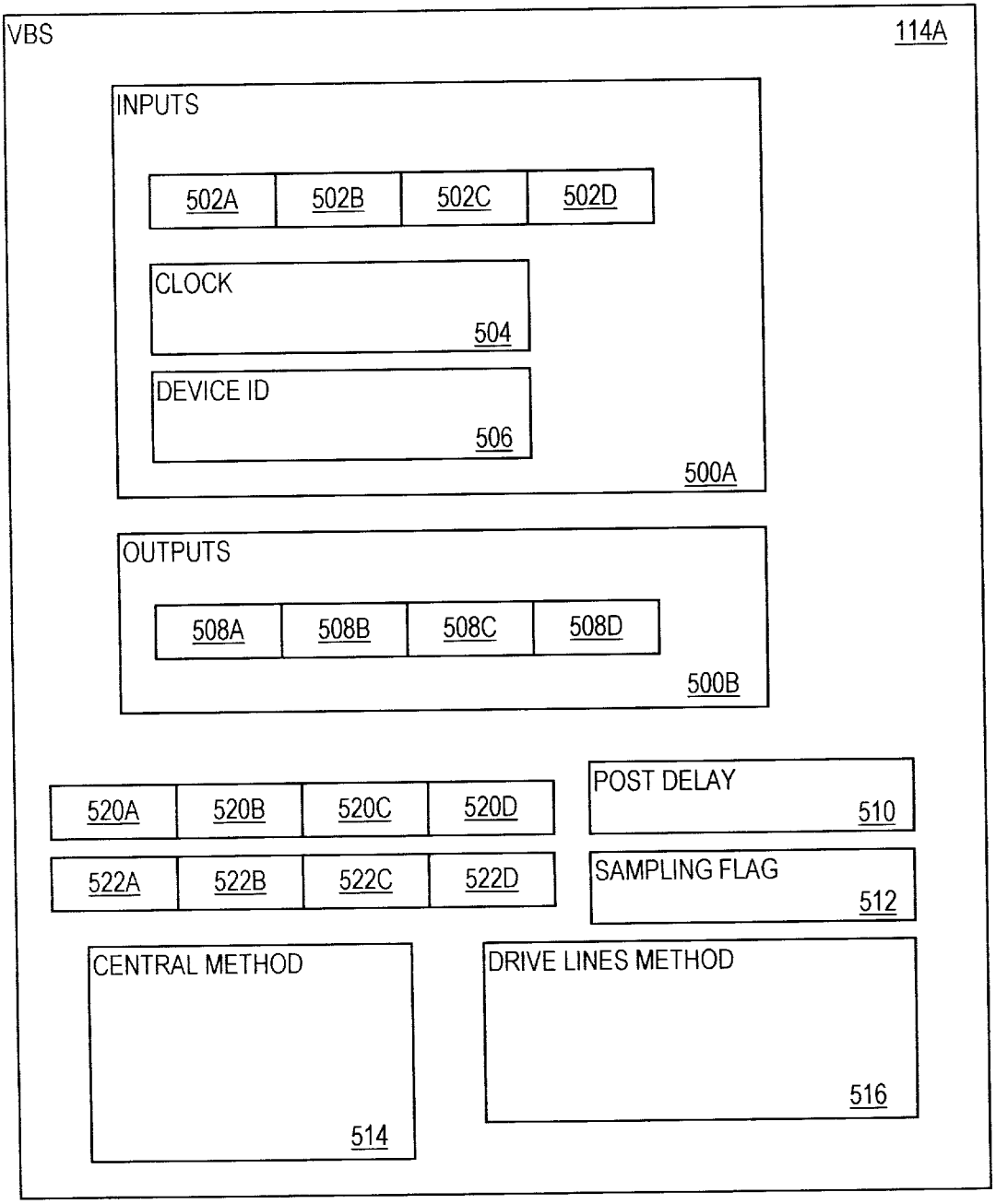
FIG. 5 is a block diagram of a virtual bus stub of FIG. 4 in greater detail.

VBS 114A is shown in greater in detail in FIG. 5. VBS 114A includes a number of input fields 500A and output fields 500B which are used to simulate input signals and output signals, respectively, of VBS 114A. As used herein, a field is a collection of data which collectively define a particular piece of information. Simulation system 116A (FIG. 1) stores in input fields 500A (FIG. 5) data representing signals received by VBS 114A. To simulate a signal received by VBS 114A, simulation system 116A (FIG. 1) stores in the appropriate field of input fields 500A (FIG. 5) data representing the received signal. For example, input fields 500A include a clock field 504 which represents a clock signal applied to VBS 114A. When the clock signal changes from a logical value of "0" to a logical value of "1," simulation system 116A (FIG. 1) stores data representing the logical value "1" in clock field 504.

Input fields 500A further include data input fields 502A–D and a device identifier field 506. Data input fields 502A–D each correspond to a line of bus 214 (FIG. 2) which can be driven by DSP 112A (FIG. 5). Each of data input fields 502A–D stores data representing a simulated signal received from DSP 112A at the input of an input buffer such as input buffer 402 (FIG. 4). While four such data input fields are shown in FIG. 5, it is appreciated that any number of data input fields can be included in input fields 500A to represent any number of lines of a bus such as bus 214 (FIG. 2). Device identification field 506 which uniquely identifies VBS 114A from all other devices of simulation system 116A.

Output fields 500B include data output fields 508A–D, each of which corresponds to a line of bus 214 (FIG. 2). Each of data output fields 508A–D (FIG. 5) store data representing a simulated signal driven on line 414 (FIG. 4) at the output of an output buffer such as output buffer 408 (FIG. 4).

VBS 114A (FIG. 5) also includes sampled input fields 520A–D and resolved output fields 522A–D. Each of sampled input fields 520A–D corresponds to a respective one of data input fields 502A–D and stores data representing the simulated state of a respective line of bus 214 (FIG. 2) as driven by DSP 112A (FIG. 5). For example, sampled input field 520A stores data representing the simulated state stored in sampled input register 404 (FIG. 4). Each of resolved output fields 522A–D (FIG. 5) corresponds to a respective one of data output fields 508A–D and stores data representing the simulated state of a respective line of bus 214 (FIG. 2) as resolved by resolver 302 (FIG. 4). For example, resolved output field 522A stores data representing the simulated state stored in resolved output register 406 (FIG. 4). While four such data output fields are shown in FIG. 5, it is appreciated that any number of data output fields can be included in output fields 500B to represent any number of lines of a bus such as bus 214 (FIG. 2).

In addition, VBS 114A includes a post delay field 510 and sampling flag 512. A flag is a field which includes data indicating one of two possible states, e.g., true or false. Post delay field 510 and sampling flag 512 are described in greater detail below. VBS 114A further includes a central method 514 and a drive lines method 512, each of which is a collection of data and computer instructions which define the behavior of the circuit simulated by VBS 114A. As described above, VBS 114A simulates the net effect on bus 214 (FIG. 2) by all devices other than devices simulated by DSP 112A (FIG. 4), e.g., all devices other than circuit part 212A (FIG. 2). Central method 514 (FIG. 5) defines the overall behavior simulated by VBS 114A, and, as described more completely below, drive lines method 512 defines a portion of the behavior simulated by VBS 114A. In simulating circuitry represented by VBS 114A, simulation system 116A (FIG. 1) retrieves computer instructions of central method 514 (FIG. 5) or drive lines method 516 and issues the retrieved computer instructions to processor 102A (FIG. 1) to effect the behavior defined by VBS 114A.

Processing according to central method 514 (FIG. 5) is represented by logic flow diagram 600 (FIG. 6), in which processing begins in step 602. In step 602, VBS 114A (FIG. 5) creates mailboxes for communication with resolver 302 (FIG. 4). Mailboxes and the use of mailboxes to effect communication between simulation system 116A and hub 110A are described more completely in the Interface Application and that description is incorporated herein by reference. Processing transfers to step 604 (FIG. 6) in which VBS 114A (FIG. 4) registers with resolver 302. VBS 114A registers with resolver 302 by sending to resolver 302 a register message which identifies VBS 114A. Registration messages are described more completely in the Interface Application and that description is incorporated herein by reference. As described more completely below, resolver 302 waits to receive simulated bus state signals from every VBS which participates in the collective simulation of bus 214 (FIG. 2), e.g., from each of VBSs 114A and 114B (FIG. 3). By registering with resolver 302, VBS 114A ensures that resolver 302 will wait for simulated bus signals from VBS 114A during each resolution of the simulated state of bus 214 (FIG. 2). Processing transfers from step 604 (FIG. 6) to step 606, in which VBS 114A (FIG. 5) initializes sampling flag 512 to store data indicating that VBS 114A is not currently sampling line 414.

Figure 6:
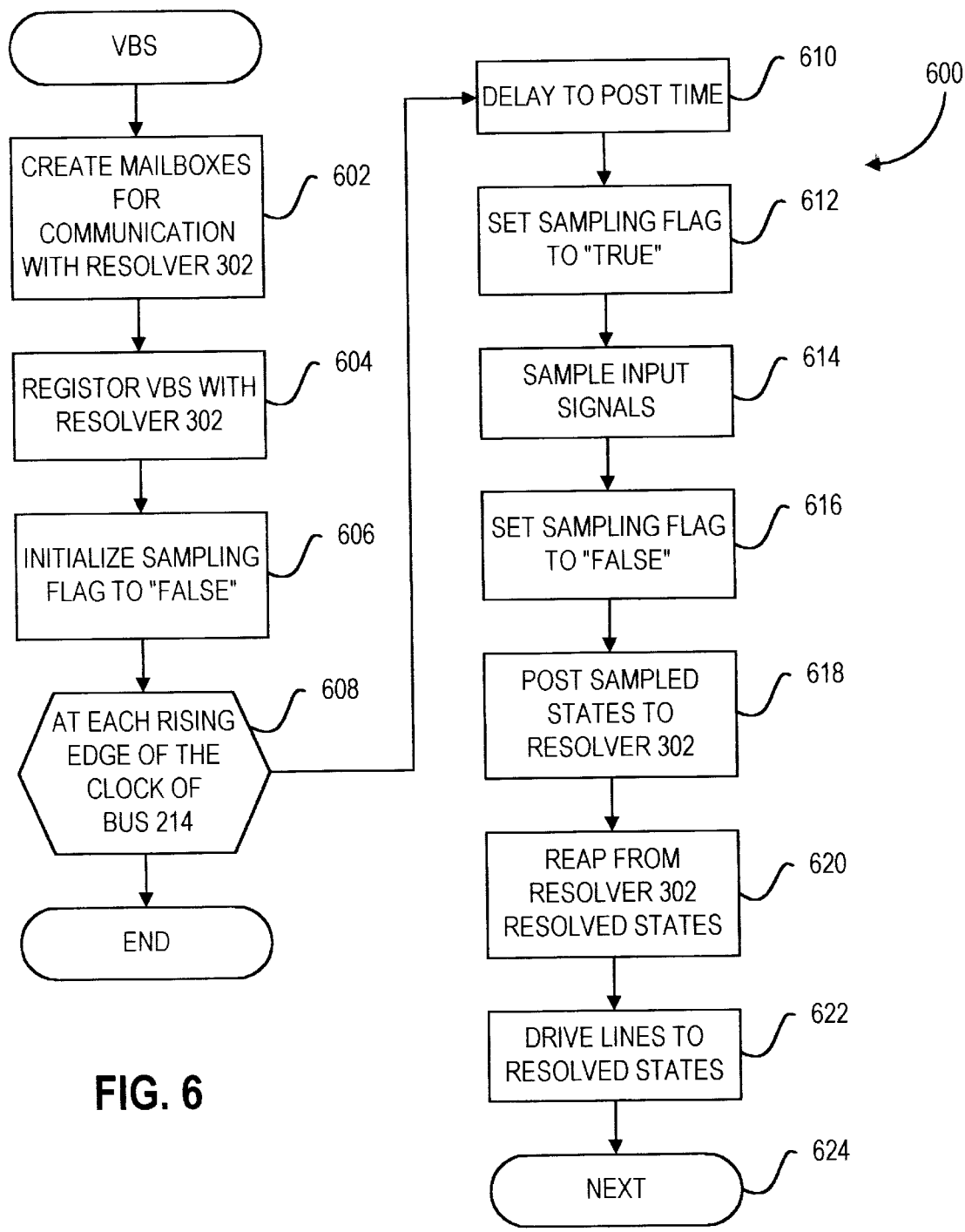
FIG. 6 is a logic flow diagram representing the processing of the virtual bus stub of FIG. 4.

Processing transfers to loop step 608 (FIG. 6) which, in conjunction with next step 624, defines a loop of steps 610–622 which are executed as each rising edge of the simulated clock signal of VBS 114A (FIG. 5), i.e., the simulated signal stored in clock field 504. For each rising edge of the simulated clock signal, processing transfers from loop step to step 610 (FIG. 6).

Figure 7:
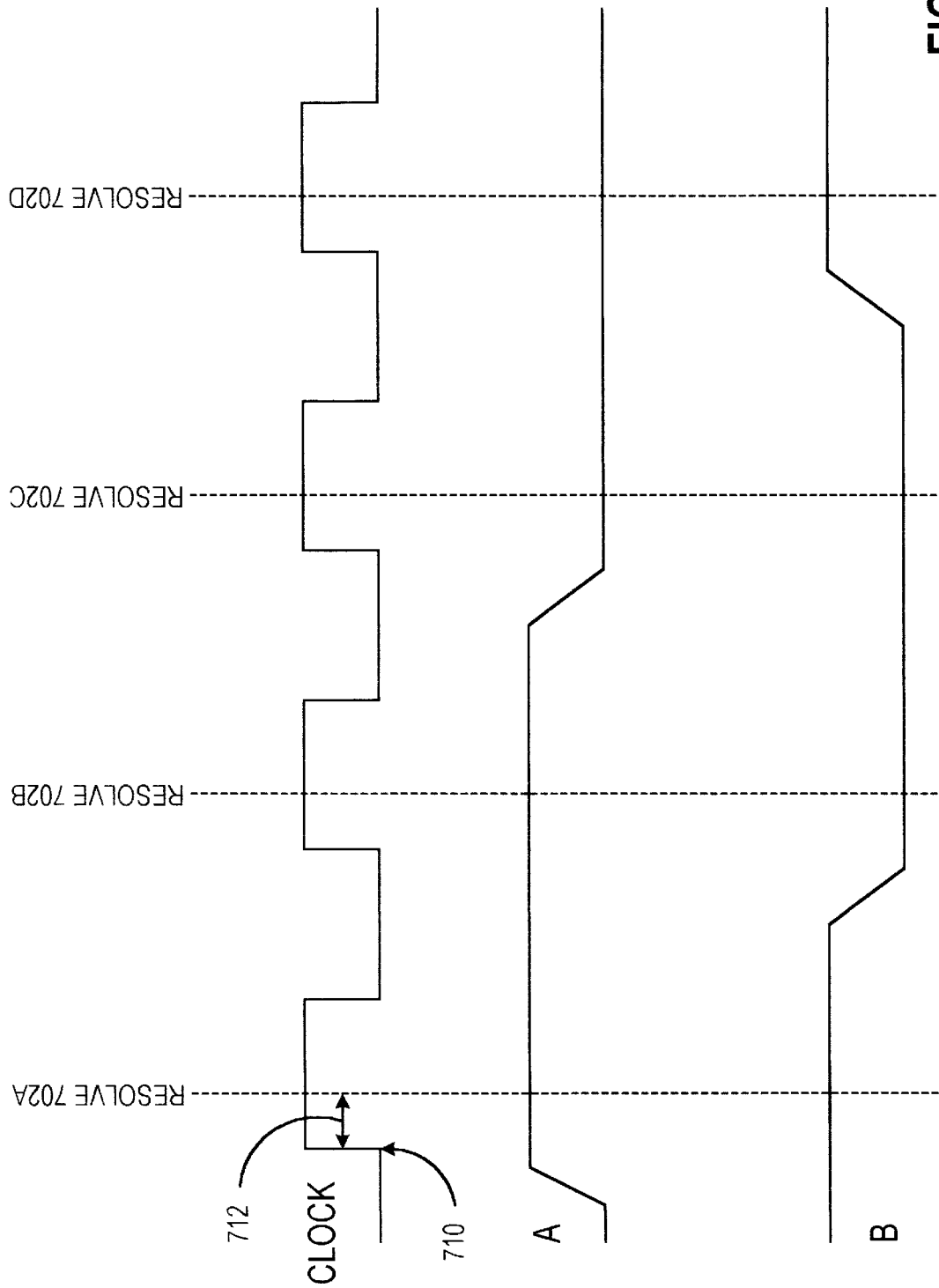
FIG. 7 is a timing diagram illustrating the time at which resolution of a virtual bus state takes place.

In step 610, VBS 114A (FIG. 5) delays for a period of simulated time indicated by data stored in post delay field 510. Simulated time is kept by simulation system 116A (FIG. 1) and represents time elapsing during operation of the circuit simulated by simulation system 116A. FIG. 7 shows simulated signals A, B, and CLOCK of bus 214 (FIG. 2). After a delay 712 (FIG. 7) after rising edge 710 of simulated clock signal CLOCK, i.e., at resolve time 702A, posting by VBS 114A (FIG. 4) is initiated. By delaying a period of time from the rising edge of the clock signal represented by clock field 504 (FIG. 5), the state of bus 214 (FIG. 2) is resolved at a simulated time at which bus 214 should have a steady state.

VBS 114A posts simulated bus signals to resolver 302 by initiating a remote procedure call to resolver 302. While resolver 302 processes the remote procedure call, execution of simulation system 116A is suspended pending a return message from resolver 302 which indicates to VBS 114A that resolver 302 has completed processing in accordance with the remote procedure call ("RPC"). The RPC protocol is described more completely in the Interface Application and that description is incorporated herein by reference. The return message includes data representing the resolved state of bus 214 (FIG. 2) and therefore effects reaping by VBS 114A.

From step 610 (FIG. 6), processing transfers to step 612 in which VBS 114A (FIG. 5) sets sampling flag 516 to indicate that VBS 114A is in the process of sampling bus lines, e.g., line 414 (FIG. 4). As described more completely below, setting sampling flag 516 to indicate sampling of line 414 is in progress places data output buffer 408 (FIG. 4) in a high impedance state in which VBS 114A cannot drive bus lines, e.g., line 414. Processing transfers to step 614 (FIG. 6).

In step 614, VBS 114A (FIG. 4) samples line 414. Specifically, VBS 114A (FIG. 5) moves data from data input fields 502A–D into sampled input fields 520A–D, respectively. Step 614 is performed after allowing a very small amount of simulation time pass after performance of step 612 to allow any effect of VBS 114A on the state of line 414 to dissipate. Processing transfers from step 614 (FIG. 6) to step 616. In step 616, VBS 114A (FIG. 5) sets sampling flag 512 to indicate that VBS 114A is no longer sampling bus lines, e.g., line 414 (FIG. 4). In step 618 (FIG. 6), to which processing transfers from step 616, VBS 114A (FIG. 5) posts the data representing the simulated bus signals sampled from bus lines, e.g., line 414 (FIG. 4), as represented in sampled input fields 520A–D (FIG. 5), i.e., sends such data to resolver 302 (FIG. 4) by calling a remote resolve procedure which is described more completely below. As described more completely above, execution of simulation system 116A is suspended during the resolution of the simulated state of bus 214 (FIG. 2) and resumes when the resolution is complete. Processing transfers from step 618 (FIG. 6) to step 620 when execution of simulation system 116A (FIG. 4) resumes.

Figure 8:
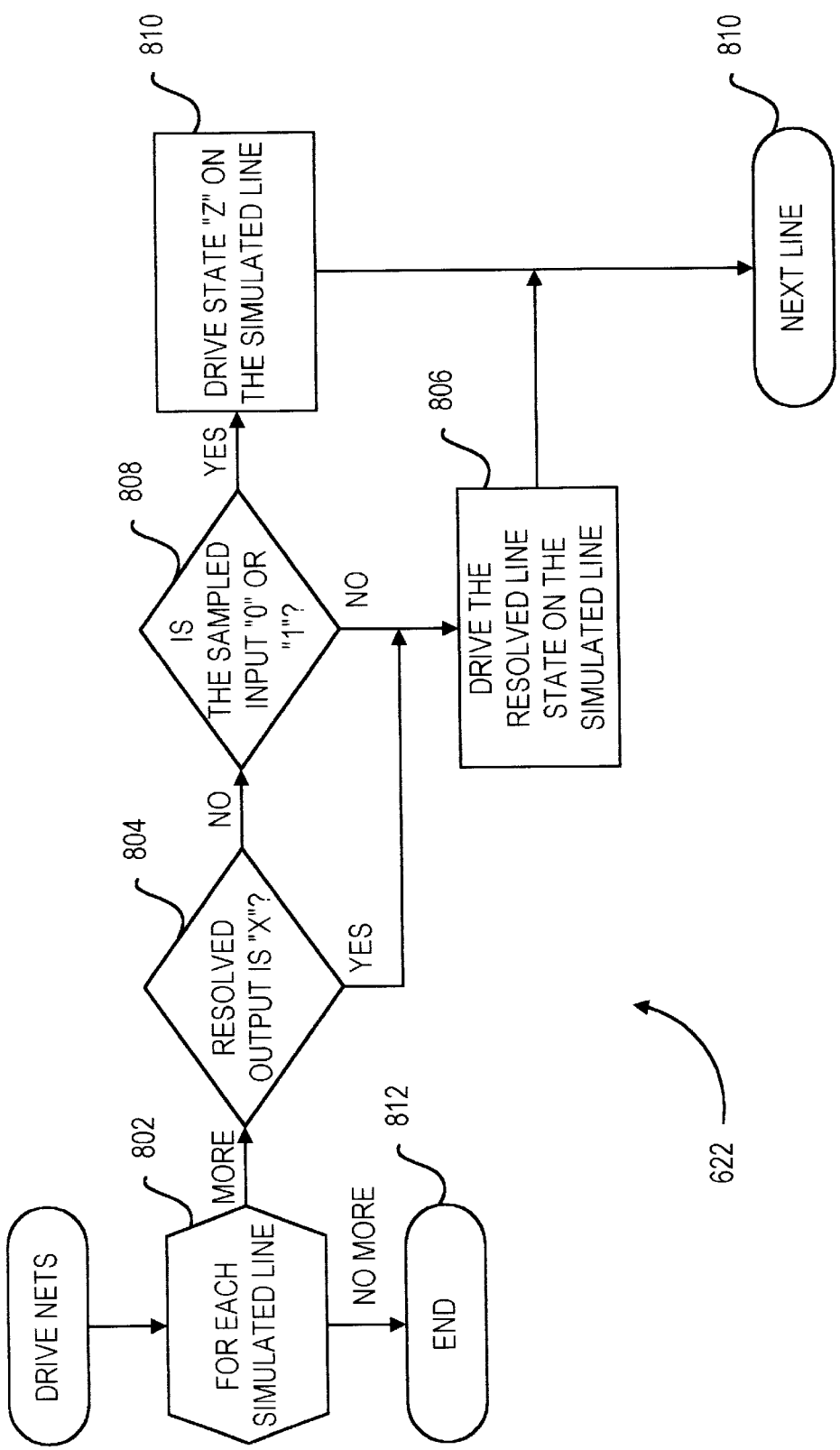
FIG. 8 is a logic flow diagram representing more completely the processing of a step of the logic flow diagram of FIG. 6.

In step 620 (FIG. 6), VBS 114A (FIG. 5) reaps from resolver 302 (FIG. 4) data representing the simulated state of bus 214 (FIG. 2) as resolved by resolver 302 (FIG. 4) and stores the data in resolved output fields 522A–D (FIG. 5). As described above, VBS 114A reaps such data by receiving from resolver 302 a return message in accordance with the RPC protocol described in the Interface Application as briefly described above. Processing transfers from step 620 (FIG. 6) to step 622 in which VBS 114A (FIG. 5) drives simulated output signals represented by data output fields 508A–D according to the simulated states represented in resolved output fields 522A–D, respectively. Processing according to step 622 (FIG. 6) is defined by drive lines method 516 (FIG. 5) and is shown in greater detail as logic flow diagram 622 (FIG. 8).

Drive lines method 516 (FIG. 5) specifies the behavior of VBS 114A in driving line 414 (FIG. 4) and other lines of bus 214 (FIG. 2) and is specific to the particular type of bus represented by VBS 114A, i.e., to the particular bus protocol of bus 214 (FIG. 2). Therefore, logic flow diagram 622 (FIG. 8) is merely an illustrative example of a method by which VBS 114A (FIG. 4) can drive a bus line, e.g., line 414.

Processing according to logic flow diagram 622 (FIG. 8) begins in loop step 802 which, in conjunction with next step 812, defines a loop in which each of the lines of bus 214 (FIG. 2) simulated by VBS 114A (FIG. 5) is processed. During each iteration of the loop defined by loop step 802 (FIG. 8) and next step 812, the simulated line processed is referred to as the subject simulated line. For each simulated line, processing transfers from loop step 802 to decision step 804.

In decision step 804, VBS 114A (FIG. 5) compares the resolved signal of the subject simulated line to a logical "X" which, as described below, represents an unknown or invalid state. If the resolved signal of the subject simulated line is not a logical "X", processing transfers from decision step 804 to decision step 808 which is described below. Conversely, if the resolved signal of the subject simulated line is a logical "X", processing transfers from decision step 804 to step 806.

In step 806 (FIG. 8), VBS 114A (FIG. 5) transfers to DSP 112A (FIG. 4) the signal received from resolver 302 which corresponds to the subject simulated line. Specifically, VBS 114A (FIG. 5) copies data from the one of resolved output fields 522A–D corresponding to the subject simulated line, which is referred to as the subject resolved output field in the context of logic flow diagram 622 (FIG. 8), and stores the copied data in the one of data output fields 508A–D (FIG. 5) corresponding to the subject simulated line. In the context of logic flow diagram 622 (FIG. 8), the one of data output fields 508A–D (FIG. 5) corresponding to the subject simulated line is referred to as the subject data output field. As described above, data stored in the subject data output field represents the simulated state of the subject simulated line from the perspective of DSPs 112A and 112B (FIG. 3). By copying data from the subject resolved output field to the subject data output field, VBS 114A (FIG. 4) drives on the subject simulated line, e.g., line 414, the resolved signal of the subject simulated line. Processing transfers from step 806 (FIG. 8) through next step 812 to loop step 802 in which the next simulated line of bus 214 (FIG. 2) is processed according to the loop defined by loop step 802 and next step 812.

In decision step 808, to which processing transfers from decision step 804 if the resolved signal of the subject simulated line is not a logical "X", VBS 114A (FIG. 5) determines whether DSP 112A is driving the subject simulated line by comparing the simulated signal represented in the one of sampled input fields 520A–D which corresponds to the subject simulated line and which is referred to as the subject sampled input field in the context of logic flow diagram 622 (FIG. 8) to logical values of "1" and "0." If DSP 112A is not driving the subject simulated line, the subject sampled input field stores data representing a simulated signal having a logical value of "Z" and processing transfers from decision step 804 to step 806 which is described above. Conversely, if DSP 112A is driving the subject simulated line, the subject sampled input field stores data representing a simulated signal having a logical value of either "1" or "0" and processing transfers from decision step 808 to step 810. Logical values "Z" and "X" are described in greater detail below.

In step 810, data output buffer 408 (FIG. 4) of VBS 114A is put in a high impedance state to prevent VBS 114A from driving the subject simulated line, e.g., line 414. Processing transfers from step 810 (FIG. 8) through next step 812 to loop step 802 in which the next simulated line of bus 214 (FIG. 2) is processed according to the loop defined by loop step 802 (FIG. 8) and next step 812. Once each of the simulated lines of bus 214 (FIG. 2) is processed according to the loop defined by loop step 802 (FIG. 8) and next step 812, processing according to logic flow diagram 622, and therefore step 622 (FIG. 6) completes.

From step 622, processing transfers through next step 624 to loop step 608 from which processing transfers to step 610 at the next rising edge of the simulated signal represented in clock field 504 (FIG. 5) of VBS 114A. Thus, for DSP 112A (FIG. 4), VBS 114A simulates the cumulative behavior of all circuitry coupled to circuitry simulated by DSP 112A through a particular bus, e.g., bus 214 (FIG. 2). VBS 114A (i) samples from line 414, which simulates a line of bus 214 (FIG. 2), a simulated signal driven on line 414 by DSP 112A; (ii) cooperates with resolver 302 (FIG. 3) and VBS 114B to resolve, from the sampled signal and analogous signals sampled by other VBSs, a simulated signal for the line of bus 214 (FIG. 2) represented by line 414 (FIG. 4); and (iii) drives on line 414 the resolved signal which can then be sampled from line 414 by DSP 112A.

DSP 112A transfers data to and from VBS 114A through line 414 in precisely the same manner DSP 112A would transfer data to and from DSP 112B (FIG. 3) and other simulated circuit parts through line 414 as if DSP 112B and the other simulated circuit parts were processed by simulation system 116A. As a result, DSPs 112A and 112B require no adaptation to be distributed among difference simulation systems, e.g., simulation systems 116A and 116B. In addition, VBSs 114A and 114B cooperate to simulate the cumulative behavior of all circuitry coupled to bus 214 (FIG. 2) in a manner which is independent of the particular behavior of such circuitry. For example, VBS 114A simulates for simulation system 116A the behavior of DSP 112B (FIG. 3) with respect to simulating access to bus 214 (FIG. 2) by circuit part 212B without any adaptation which is specific to the design of DSP 112B. Thus, to distribute DSPs 112A and 112B among different simulation systems which can execute on different constituent computers of a computer network, a design verification engineer need only construct, without regard for the particular design of the various DSPs, a VBS for each DSP for each bus through which the DSPs communicate. Distribution of respective parts of a complex simulated circuit according to the present invention is therefore simple and efficient, and the present invention therefore provides a convenient and powerful mechanism through which distributed parts of a complex circuit simulation interact to accurately simulate the complex circuit.

Figure 9:
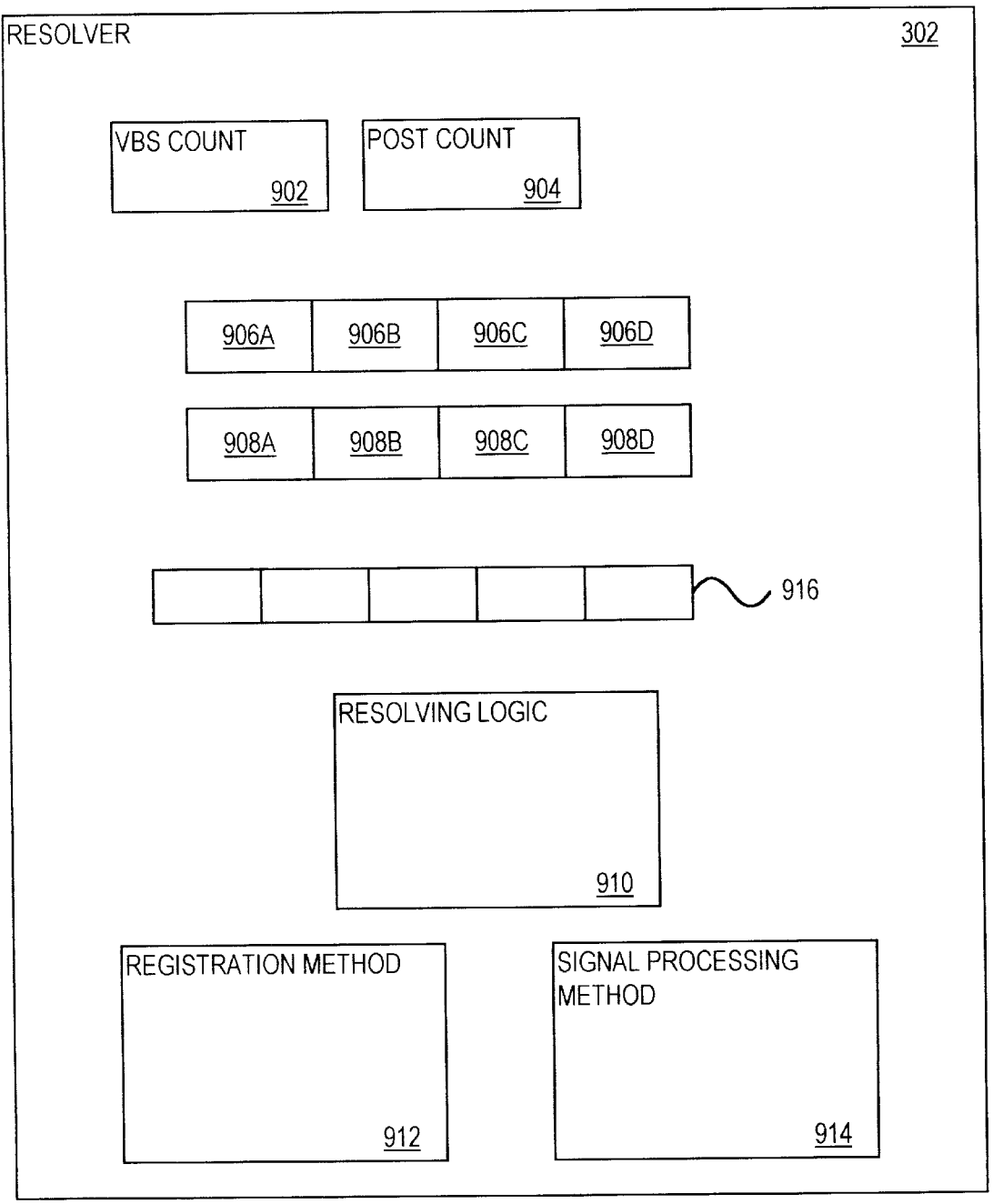
FIG. 9 is a block diagram of a resolver of the hub of FIGS. 3 and 4.

Resolver 302 (FIG. 4) is shown in greater detail in FIG. 9. Resolver 302 includes a number of fields and methods used to resolve simulated lines of bus 214 (FIG. 2) in a manner described more completely below. Specifically, resolver 302 includes (i) a VBS count field 902, (ii) a post count field 904, (iii) current resolve buffer fields 906A–D, (iv) next resolve buffer fields 908A–D, (v) resolving logic 910, (vi) a registration method 912, (vii) a signal processing method 914, and (viii) a VBS hold list 916. Each of the components of resolver 302 is described more completely below in the context of the resolution of the simulated state of bus 214 (FIG. 2).

Registration method 912 is a collection of data fields and computer instructions which define the steps performed by resolver 302 in registering each of VBSs 114A (FIG. 3) and 114B with resolver 302 of hub 110A. As described above, each of VBSs 114A and 114B send signals to resolver 302 to post and reap simulated bus signals. Signal processing method 914 is a collection of data fields and computer instructions which define the steps performed by resolver 302 in processing such signals received from VBSs 114A (FIG. 3) and 114B by resolver 302.

Figure 10:
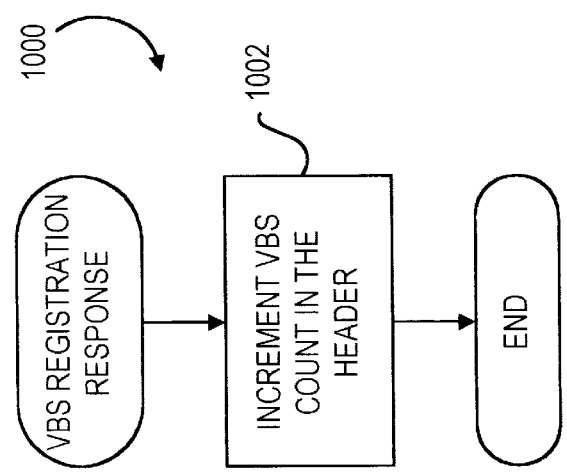
FIG. 10 is a logic flow diagram of the registration of a virtual bus stub in the hub of FIGS. 3 and 4.

As described above with respect to step 604 (FIG. 6), VBS 114A (FIG. 3) registers with resolver 302. In response to a registration message received from VBS 114A, resolver 302 performs registration method 912 (FIG. 9), processing according to which is shown as logic flow diagram 1000 (FIG. 10). Processing according to logic flow diagram 1000 involves a single step 1002 in which resolver 302 (FIG. 9) increments the value represented in VBS count field 902. Initially, VBS count field 902 stores data representing the value zero. After each VBS of the simulation controlled through hub 110A registers with resolver 302, VBS count field 902 stores data representing the number of VBSs which must post simulated bus signals during each resolution of the simulated signals of a bus. Thus, through registration of each of the VBSs which collectively simulate a bus, e.g., bus 214 (FIG. 2), resolver 302 can determine when each of the VBSs have posted during a particular resolution of the simulated signals of the bus and the resolution is therefore complete.

Figure 11:
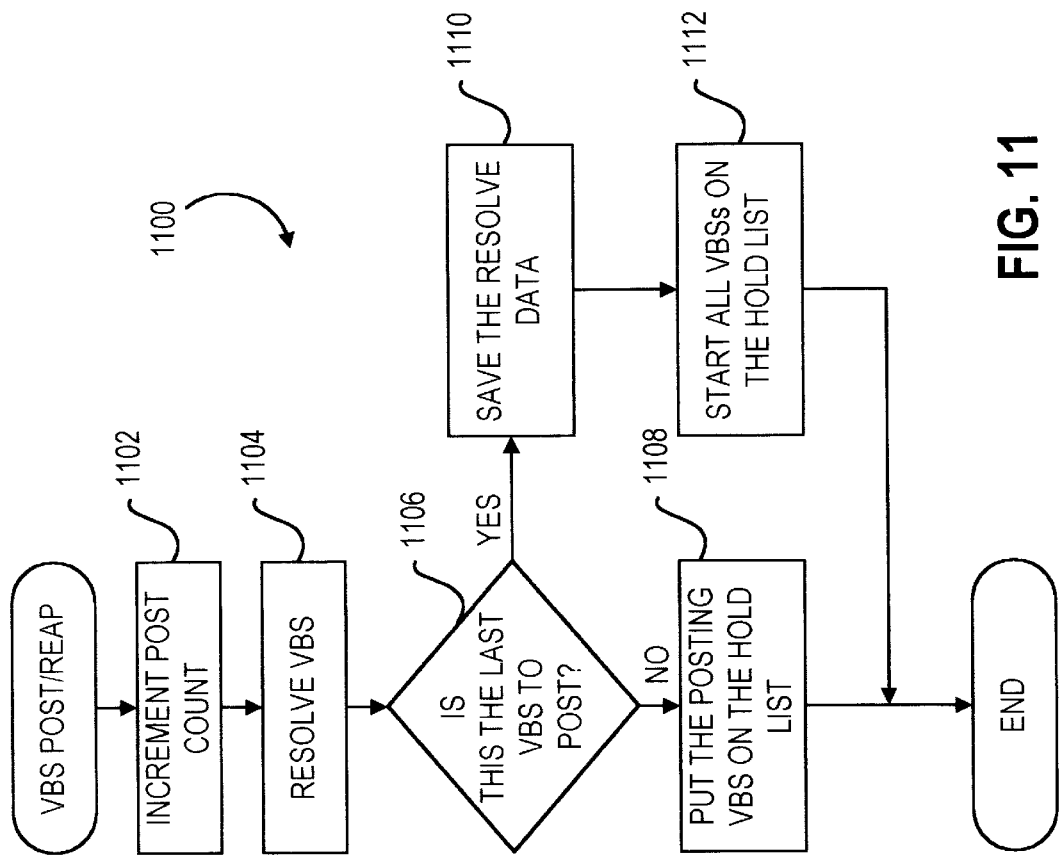
FIG. 11 is a logic flow diagram representing the processing of the hub of FIGS. 3 and 4 in response to a signal received from a virtual bus stub.

As described above, VBS 114A (FIG. 4) posts simulated bus signals to, and reaps simulated bus signals from, resolver 302 by sending a message containing simulated bus signals to resolver 302. When resolver 302 receives the message from VBS 114A, resolver 302 performs signal processing method 914 (FIG. 9) whose performance is illustrated as logic flow diagram 1100 (FIG. 11). Processing according to logic flow diagram 1100 begins in step 1102.

Figure 12:
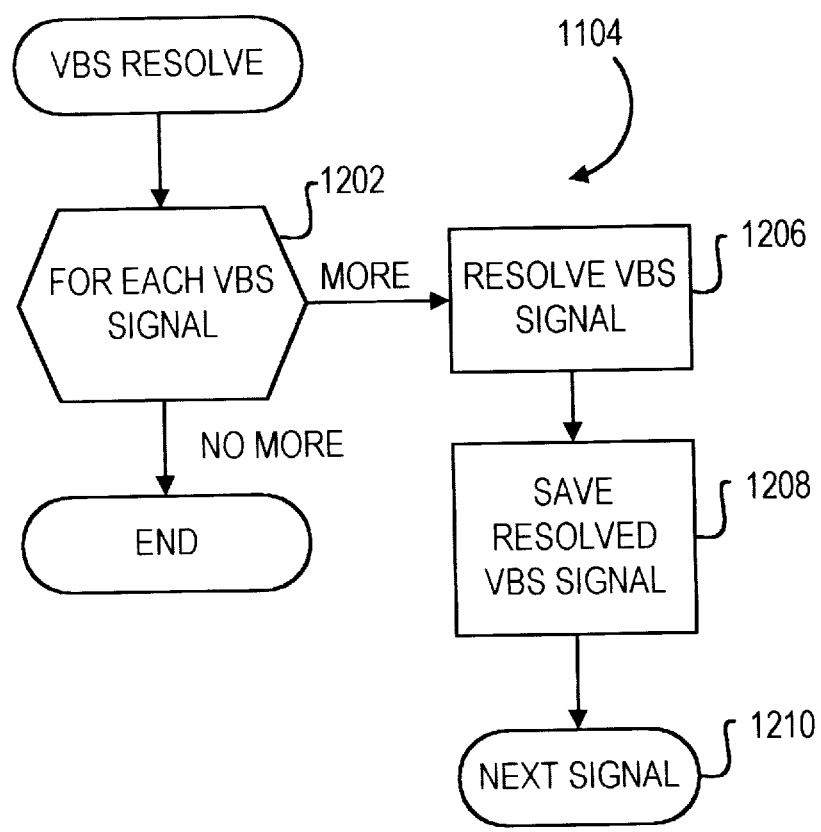
FIG. 12 is a logic flow diagram representing the processing of the hub of FIGS. 3 and 4 in resolving a virtual bus state according to post signals received from virtual bus stubs.

In step 1102, resolver 302 (FIG. 9) increments the number, as represented in post count field 904, of VBSs which have posted during the current simulated cycle of the simulated bus. From step 1102, processing transfers to step 1104 in which resolver 302 (FIG. 9) resolves the posted data with the current resolved signals of the simulated bus. Step 1104 is shown in greater detail as logic flow diagram 1104 (FIG. 12).

Processing according to logic flow diagram 1104 begins with loop step 1202 which, in conjunction with next step 1208, defines a loop in which each simulated signal of a line bus 214 (FIG. 2) is processed according to steps 1204 and 1206. In the context of logic flow diagram 1104, the "subject simulated signal" refers to the particular simulated signal of the posted data processed during a particular iteration of the loop defined by loop step 1202 and next step 1208. Also in the context of logic flow diagram 1104, the "subject next resolve buffer field" refers to the one of next resolve buffer fields 908A–D (FIG. 9) which corresponds to the subject simulated signal. For each simulated signal of the posted data, processing transfers from loop step 1202 (FIG. 12) to step 1204.

In step 1204, resolver 302 (FIG. 9) resolves the subject simulated signal with previously posted simulated signals corresponding to the line of bus 214 (FIG. 2) which also corresponds to the subject simulated signal. The subject next resolve buffer field represents the simulated state of the line according to simulated states previous posted in the current simulated cycle of bus 214 (FIG. 2). Resolution by resolver 302 (FIG. 9) of the newly posted subject simulated signal with the subject next resolve buffer field is performed by resolve logic 910, which is shown in greater detail in FIG. 13.

In this illustrative embodiment, each of the lines of bus 214 (FIG. 2) can have one of four states: (i) a logical "0", (ii) a logical "1", (iii) a high impedance state represented as a logical "Z", and (iv) an invalid or unknown state which can result from a bus collision, for example, and which is represented as a logical "X." It is appreciated that other logical values can be represented and processed in a generally analogous manner. In resolve logic 910 (FIG. 13), registers 1302, 1304, and 1306 represent, respectively, the subject simulated signal, the subject next resolve buffer field, and the result of resolving the subject simulated signal with the subject next resolve buffer field. The representation of each of the four states in registers 1302, 1304, and 1306 is shown in Table A below.

TABLE A

| Logical Value | 1302B | 1302A | 1304B | 1304A | 1306B | 1306A |
|---|---|---|---|---|---|---|
| 0 | 0 | 0 | 0 | 0 | 0 | 0 |
| 1 | 0 | 1 | 0 | 1 | 0 | 1 |
| Z | 1 | 0 | 1 | 0 | 1 | 0 |
| X | 1 | 1 | 1 | 1 | 1 | 1 |

Figure 13:
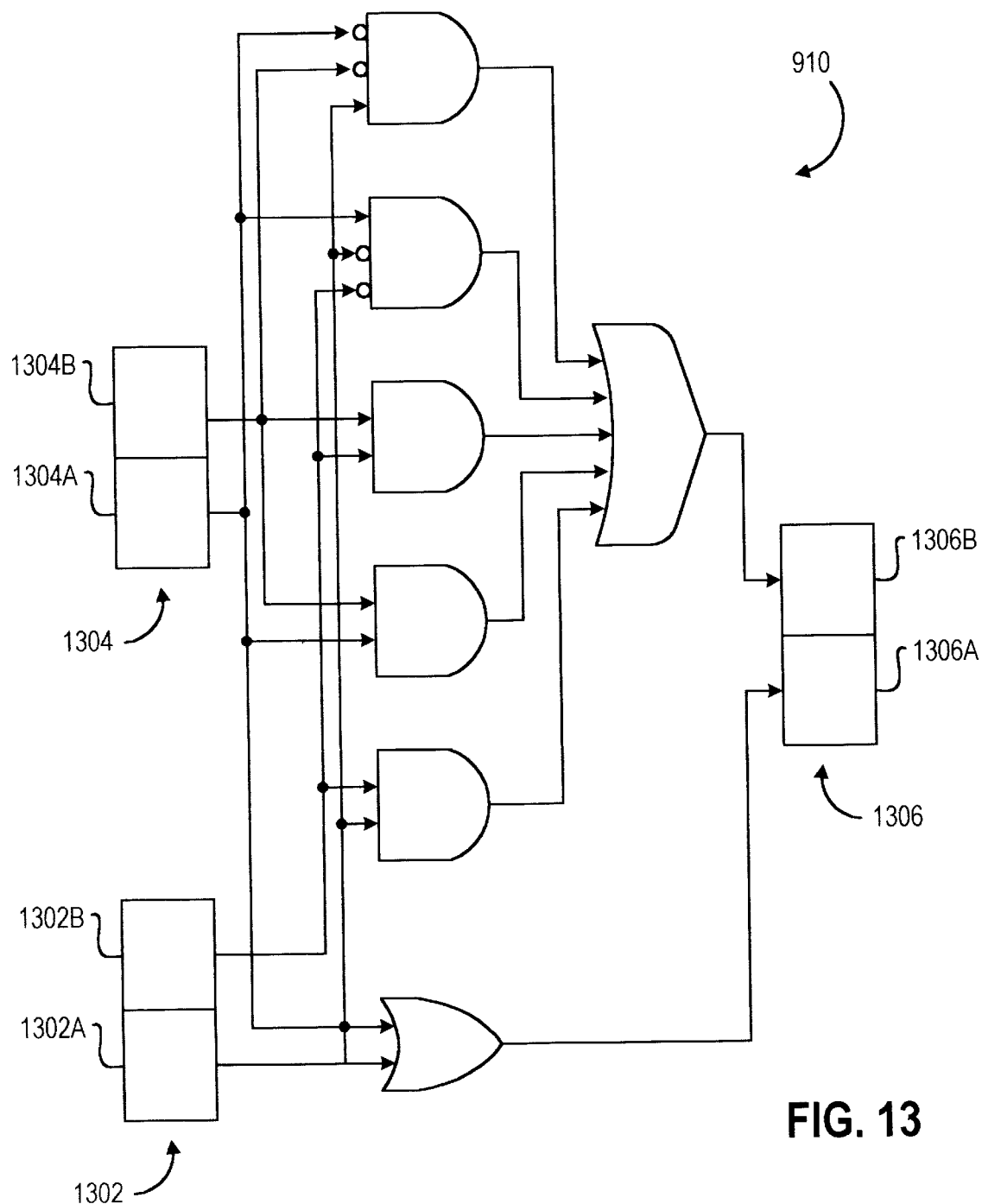
FIG. 13 is a block diagram of resolve logic of the hub of FIGS. 3 and 4 in resolving the virtual bus state.

Table B below shows the resolution of the subject simulated signal with the subject next resolved buffer field according to resolve logic 910 (FIG. 13).

TABLE B

| Register 1302 | Register 1304 | Register 1306 |
|---|---|---|
| 0 | 0 | 0 |
| 0 | 1 | X |
| 0 | Z | 0 |
| 0 | X | X |
| 1 | 0 | X |
| 1 | 1 | 1 |
| 1 | Z | 1 |
| 1 | X | X |
| Z | 0 | 0 |
| Z | 1 | 1 |
| Z | Z | Z |
| Z | X | X |
| X | 0 | X |
| X | 1 | X |
| X | Z | X |
| X | X | X |

As shown in Table B, the state of simulated next resolve buffer field as represented in register 1304 is stored in register 1306 by resolve logic 910 (FIG. 13) if the subject simulated signal as represented in register 1302 is in a high impedance state, i.e., logical "Z." Thus, if DSP 112A (FIG. 4) does not drive the subject simulated signal, the state of the corresponding line of bus 214 (FIG. 2) remains unchanged. Conversely, if the subject next resolve buffer field as represented in register 1304 is in a high impedance state, resolve logic 910 stores in register 1306 the state of the subject simulated signal as represented in register 1302. Each of next resolve buffer fields 908A–D (FIG. 9) is initialized to represent a logical value of "Z" prior to each resolution of the simulated state of bus 214 (FIG. 2). Thus, if DSP 112A (FIG. 4) is the first simulated device to drive the subject simulated signal during the current resolution of the simulated state of bus 214 (FIG. 2), the state of the corresponding line of bus 214 is changed to the state driven by DSP 112A (FIG. 4).

If either the subject simulated state or the subject next resolve buffer field is in an unknown or invalid state, i.e., has a logical value of "X," resolve logic 910 (FIG. 13) stores the logical value "X" in register 1306 to reflect the unknown or invalid state. If both the subject simulated signal and the subject next resolve buffer field are a logical "0" or both are a logical "1," resolve logic 910 (FIG. 13) stores in register 1306 the shared logical value of the subject simulated signal and the subject next resolve buffer field. Thus, for example, if two simulated circuits, e.g., DSPs 112A and 112B (FIG. 3) both drive a single line of bus 214 (FIG. 2) to the same state, e.g., to a logical "1", then the state of the line of bus 214 is that same state. If the subject simulated state is a logical "0" and the subject next resolve buffer field is a logical "1" or if the subject simulated state is a logical "1" and the subject next resolve buffer field is a logical "0," a bus collision is detected and resolve logic 910 (FIG. 13) stores in register 1306 a logical value of "X." Since the subject next resolve buffer field reflects the resolved state of a particular line of bus 214 (FIG. 2) according to previously posted state data, the subject next resolve buffer field can only have a logical value of "0" or "1" if another VBS previously posted a simulated signal having such a logical value. If another VBS subsequently posts a logically inconsistent, simulated signal for the same line of bus 214, a bus collision is detected and reflected in register 1306 (FIG. 13) by resolve logic 910.

Processing transfers from step 1204 (FIG. 12) to step 1206 in which the newly resolved state stored in register 1306 (FIG. 13) is stored in the subject next resolve buffer field, replacing the state previously represented in the subject next resolve buffer field. From step 1206 (FIG. 12), processing transfers through next step 1208 to loop step 1202 in which the next of the simulated signals of the posted data is processed according to steps 1204 and 1206. Once each of the simulated signals of the posted data is processed according to the loop defined by loop step 1202 and next step 1208, processing according to logic flow diagram 1104, and therefore step 1104 (FIG. 11) completes.

Once the data posted by VBS 114A (FIG. 4) is resolved according to step 1104 (FIG. 11), processing transfers to decision step 1106 in which resolver 302 (FIG. 9) determines whether the currently posting VBS is the last VBS to post for the current resolution of the simulated state of bus 214 (FIG. 2). Resolver 302 (FIG. 9) makes such a determination by comparing the value stored in VBS count field 902 to the value stored in post count field 904. If the compared values are equal, the currently posting VBS is the last VBS to post data for the current resolution of the simulated state of bus 214 (FIG. 2) and processing transfers from decision step 1106 (FIG. 11) to step 1110 which is described below. Conversely, if the compared values are not equal, other VBSs have yet to post data for the current resolution of the simulated state of bus 214 (FIG. 2) and processing transfers from decision step 1106 (FIG. 11) to step 1108.

In step 1108, resolver 302 (FIG. 9) stores on VBS hold list 916 a reference to the posting VBS. Resolver 302 suspends execution of the simulation system which includes the posting VBS by postponing completion of the remote procedure call through which the posting VBS is posting. After step 1108 (FIG. 11), processing according to logic flow diagram 1100 completes and execution of the simulation system which includes the posting VBS remains suspended.

In step 1110, to which processing transfers from decision step 1106 if the posting VBS is the last VBS to post in the current resolution of the simulated signals of bus 214 (FIG. 2), the resolved simulated state of bus 214 (FIG. 2) is saved. Specifically, resolver 302 (FIG. 9) copies data representing the respective resolved states of each of the lines of bus 214 (FIG. 2) from next resolve buffer fields 908A–D (FIG. 9) to current resolve buffer fields 906A–D, respectively. Once the simulated states have been copied from next resolve buffer fields 908A–D to current resolve buffer fields 906A–D, the resolved simulated state as stored in current resolve buffer fields 906A–D are available for reaping by VBSs such as VBSs 114A (FIG. 3) and 114B. Resolver 302 initializes each of next resolve buffer fields 908A–D such that each of next resolve buffer fields 908A–D contains data representing a logical value of "Z" to reflect that no simulated signal having a logical value of "0" or "1" has yet been posted in the next resolution of the simulated state of bus 214 (FIG. 2). Processing transfers from step 1110 (FIG. 11) to step 1112 in which resolver 302 (FIG. 9) causes execution of each simulation system which includes a VBS referenced by an item of VBS hold list 916 to resume by completing the remote procedure call by which the referenced VBS is posting. Specifically, resolver 302 sends to each referenced VBS a return message which indicates that the remote procedure call has completed. The remote procedure calling protocol implemented by hub 110A (FIG. 3) and simulation systems 116A–B, including messages and specifically return messages, is described more completely in the Interface Application and that description is incorporated herein by reference. After step 1112 (FIG. 11), processing according to logic flow diagram 1100 completes and resolver 302 (FIG. 9) sends to the simulation system containing the last posting VBS a return message to complete the remote procedure call and to allow execution of the simulation system to continue. The return message sent by resolver 302 (FIG. 9) to each VBS includes data representing the resolved signals of bus 214 (FIG. 2) and each VBS therefore reaps the resolved signals.

Thus, according to logic flow diagram 1100 (FIG. 11), resolver 302 (FIG. 3) processes signals from VBSs 114A and 114B to effect posting and reaping by such VBSs. With each simulated cycle of bus 214 (FIG. 2), (i) VBSs 114A (FIG. 3) and 114B each post data representing signals driven on bus 214 (FIG. 2) to resolver 302 (FIG. 3), (ii) resolver 302 resolves from the posted data a simulated state of bus 214 (FIG. 2), and (iii) VBSs 114A (FIG. 3) and 114B reap from resolver 302 data representing the resolved simulated state of bus 214 (FIG. 2). VBSs 114A (FIG. 3) and 114B and resolver 302 cooperate to collectively simulate bus 214 (FIG. 2) notwithstanding the distribution of VBSs 114A (FIG. 1) and 114B among different constituent computers 100A and 100B, respectively, of computer network 150. Since data is transferred between circuit parts 212A (FIG. 2) and 212B according to a bus protocol over bus 214, synchronization and cooperation between circuit parts 212A and 212B is inherent in the design of circuit parts 212A and 212B and therefore in DSPs 112A (FIG. 1) and 112B which simulate circuit parts 212A (FIG. 2) and 212B, respectively. Accordingly, distribution among constituent computers of computer network 150 (FIG. 1) of simulation of bus 214 provides a convenient and efficient division of a simulation of circuit 200 (FIG. 2).

The above description is illustrative only and is not limiting. The present invention is limited only by the claims which follow.

What is claimed is:

1. A method for simulating a circuit which includes two or more circuit parts, two or more subject circuit parts of which communicate with one another through a bus, the method comprising:

simulating in one or more computers each of the two or more subject circuit parts;

for each of the two or more subject circuit parts, forming a corresponding bus stub which receives from the subject circuit part zero or more simulated bus signals and which transmits to the subject circuit part resolved simulated bus signals; and for each cycle of a simulated clock signal of the bus, resolving the zero or more signals received by the two or more bus stubs to form the resolved simulated bus signals.

2. The method of claim 1 wherein the one or more computers includes a first computer and a second computer which are connected to form a computer network and wherein a first of the two or more subject circuit parts is simulated on the first computer; and further wherein a second of the two or more subject circuit parts is simulated on the second computer.

3. The method of claim 1 wherein the step of forming a corresponding bus stub comprises:

forming in the bus stub a simulated input buffer to receive one or more simulated driven bus signals from the corresponding one of the two or more subject circuit parts;

forming in the bus stub a simulated sampled input register to store the received simulated driven bus signals;

forming in the bus stub a simulated resolved output register to store the resolved simulated bus signals; and forming in the bus stub a simulated output buffer to transmit to the corresponding subject circuit part the resolved simulated bus signals.

4. The method of claim 3 wherein the step of forming a corresponding bus stub further comprises:

forming in the bus stub a simulated control signal which causes the simulated output buffer to produce a high impedance signal (i) when (a) the simulated sampled input register stores simulated bus signals which have a logical value of "1" or a logical value of "0" and (b) the simulated resolved output register stores resolved simulated bus signals which have a logical value of either "0" or "1" or "Z" or (ii) when a resolve signal within the bus stub indicates that the step of resolving is currently being performed.

5. The method of claim 1 wherein the step resolving comprises:

for each of one or more lines of the bus:

forming a respective one of the resolved simulated bus signals;

driving the respective resolved simulated bus signal to a logical value of "X" if any of the bus stubs receives from a corresponding subject circuit part a simulated bus signal having a logical value of "X" or if a first of the bus stubs receives from a corresponding subject circuit part a simulated bus signal having a logical value of "0" and a second of the bus stubs receives from a corresponding subject circuit part a simulated bus signal having a logical value of "1";

driving the respective resolved simulated bus signal to a logical value of "0" if a first of the bus stubs receives from a corresponding subject circuit part a simulated bus signal having a logical value of "0" and no other one of the bus stubs receives from a corresponding subject circuit part a simulated bus signal having a logical value of "1";

driving the respective resolved simulated bus signal to a logical value of "1" if a first of the bus stubs receives from a corresponding subject circuit part a simulated bus signal having a logical value of "1" and no other one of the bus stubs receives from a corresponding subject circuit part a simulated bus signal having a logical value of "0"; and driving the respective resolved simulated bus signal to a logical value of "Z" if a none of the bus stubs receives from a corresponding subject circuit part a simulated bus signal having a logical value of either "0" or "1".

6. The method of claim 1 wherein the step of resolving comprises:

posting to a resolver the simulated bus signals from each of the two or more bus stubs;

resolving within the resolver of the resolved simulated bus signals; and reaping from the resolver the resolved simulated bus signals to each of the two or more bus stubs.

7. A computer program product comprising:

a computer usable medium having computer readable code embodied therein for simulating a circuit which includes two or more circuit parts, two or more subject circuit parts of which communicate with one another through a bus, the computer readable code comprising:

two or more circuit part simulators which are each configured to simulate a respective one of the two or more subject circuit parts;

for each of the two or more subject circuit part simulators, a bus stub which is operatively coupled to a respective one or the two or more circuit part simulators and which is configured to receive from the respective circuit part simulator zero or more simulated bus signals and to transmit to the respective circuit part simulator resolved simulated bus signals; and a resolver which is operatively coupled to each of the bus stubs and which is configured to resolve the zero or more signals received by the two or more bus stubs to form the resolved simulated bus signals during each cycle of a simulated clock signal of the bus.

8. The computer program product of claim 7 wherein the one or more computers includes a first computer and a second computer which are connected to form a computer network and wherein a first of the two or more circuit part simulators is configured to execute on the first computer; and further wherein a second of the two or more circuit part simulators is configured to execute on the second computer.

9. The computer program product of claim 7 wherein each of the bus stubs comprises:

a simulated input buffer which is configured to receive one or more simulated driven bus signals from the corresponding one of the two or more circuit part simulators;

a simulated sampled input register which is operatively coupled to the simulated input buffer and to the resolver and which is configured to store the received simulated driven bus signals;

a simulated resolved output register which is operatively coupled to the resolver and which is configured to store the resolved simulated bus signals; and a simulated output buffer which is operatively coupled to the simulated resolved output register and which is configured to transmit to the corresponding circuit part simulator the resolved simulated bus signals.

10. The computer program product of claim 9 wherein each of the bus stubs further comprises:

a simulated control signal which is operatively coupled to the simulated output buffer and which is configured to cause the simulated output buffer to produce a high impedance signal (i) when (a) the simulated sampled input register holds simulated bus signals which have a logical value of "1" or a logical value of "0" and (b) the simulated resolved output register holds resolved simulated bus signals which have a logical value of either "0" or "1" or "Z" or (ii) when a resolve signal within the bus stub indicates that the step of resolving is currently being performed.

11. The computer program product of claim 7 wherein the resolver comprises:

for each of one or more lines of the bus:

a resolved simulated bus signal driver which is configured to drive the respective resolved simulated bus signal to a logical value of "X" if any of the bus stubs receives from a corresponding subject circuit part a simulated bus signal having a logical value of "X" or if a first of the bus stubs receives from a corresponding subject circuit part a simulated bus signal having a logical value of "0" and a second of the bus stubs receives from a corresponding subject circuit part a simulated bus signal having a logical value of "1";

drive the respective resolved simulated bus signal to a logical value of "0" if a first of the bus stubs receives from a corresponding subject circuit part a simulated bus signal having a logical value of "0" and no other one of the bus stubs receives from a corresponding subject circuit part a simulated bus signal having a logical value of "1";

drive the respective resolved simulated bus signal to a logical value of "1" if a first of the bus stubs receives from a corresponding subject circuit part a simulated bus signal having a logical value of "1" and no other one of the bus stubs receives from a corresponding subject circuit part a simulated bus signal having a logical value of "0"; and drive the respective resolved simulated bus signal to a logical value of "Z" if a none of the bus stubs receives from a corresponding subject circuit part a simulated bus signal having a logical value of either "0" or "1".

12. The computer program product of claim 7 wherein the resolver comprises:

a posted signal processor which is configured to receive from each of the two or more bus stubs the simulated bus signals;

resolving logic which is operatively coupled to the posted signal receiver and which is configured to resolve from the simulated bus signals the resolved simulated bus signals; and a reaped signal processor which is operatively coupled to the resolving logic and which is configured to transmit to each of the two or more bus stubs the resolved simulated bus signals.

* * * * *